(12) United States Patent
Jenkins et al.

(10) Patent No.: US 7,199,747 B2
(45) Date of Patent: Apr. 3, 2007

(54) GENERATING A FINE TIME OFFSET USING A SIGE PULSE GENERATOR

(75) Inventors: Alan Peter Jenkins, Groton, MA (US); Robert Ian Gresham, Somerville, MA (US)

(73) Assignee: M/A-Com, Inc., Lowell, MA (US)

( * ) Notice: Subject to any disclaimer, the term of this patent is extended or adjusted under 35 U.S.C. 154(b) by 68 days.

(21) Appl. No.: 11/120,770

(22) Filed: May 3, 2005

(65) Prior Publication Data

US 2006/0250293 A1    Nov. 9, 2006

(51) Int. Cl.
*G01S 13/00* (2006.01)

(52) U.S. Cl. .............................. 342/21; 342/70; 342/71; 342/72; 342/132; 342/134; 342/135; 342/137; 342/204

(58) Field of Classification Search .................. 342/21, 342/70–72, 82–88, 132, 134–137, 200–204
See application file for complete search history.

(56) References Cited

U.S. PATENT DOCUMENTS

| | | | | |
|---|---|---|---|---|
| 4,142,189 A | * | 2/1979 | Gleason ....................... | 342/109 |
| 4,267,513 A | * | 5/1981 | Driscoll et al. .............. | 327/129 |
| 4,329,686 A | * | 5/1982 | Mourou ....................... | 342/202 |
| 4,538,118 A | * | 8/1985 | Lorieux ....................... | 330/286 |
| 4,562,438 A | * | 12/1985 | Rouse et al. ................ | 342/201 |
| 6,067,040 A | | 5/2000 | Puglia ......................... | 342/134 |
| 6,087,972 A | | 7/2000 | Puglia ......................... | 342/28 |
| 6,388,609 B2 | | 5/2002 | Paese .......................... | 342/27 |
| 6,587,072 B1 | * | 7/2003 | Gresham et al. .............. | 342/70 |
| 6,614,390 B2 | | 9/2003 | Steinbuch .................... | 342/70 |
| 6,639,543 B2 | | 10/2003 | Puglia ......................... | 342/70 |
| 6,720,908 B1 | | 4/2004 | Puglia ......................... | 342/70 |
| 6,879,281 B2 | * | 4/2005 | Gresham et al. .............. | 342/70 |
| 7,098,845 B2 | * | 8/2006 | Jenkins et al. ............... | 342/194 |
| 2003/0193430 A1 | * | 10/2003 | Gresham et al. .............. | 342/70 |
| 2005/0258999 A1 | * | 11/2005 | Jenkins et al. ............... | 342/194 |

FOREIGN PATENT DOCUMENTS

JP    2006030193 A  *  2/2006

OTHER PUBLICATIONS

"A baseband processor for impulse ultra-wideband communications", Blazquez, R.; Newaskar, P.P.; Lee, F.S.; Chandrakasan, A.P.; Solid-State Circuits, IEEE Journal of vol. 40, Issue 9, Sep. 2005 Ps:1821-1828.*

* cited by examiner

*Primary Examiner*—John B. Sotomayor

(57) ABSTRACT

A method and apparatus for generating short electronic pulses using a modified differential trigger that is partly an analogue sinusoidal voltage and partly a selectable, DC voltage. The differential trigger is applied to a differential base band pulse generator having a NAND gate and AND gate. The trigger is applied to both NAND inputs and to one AND input. The NAND output is applied the other AND input. Such a circuit is an OFF state for all input states. However, as the input switches state, the NAND gate delay causes the AND gate to be ON briefly, generating a short pulse. The timing of this pulse can be controlled by varying the constant DC voltage. By using fast switching SiGe CML gates, short pulses with a controllable time off-set can be generated that are suitable for use in automotive radar applications, using only sub-GHz clocks.

20 Claims, 11 Drawing Sheets

|   |   | AND | NAND |
|---|---|-----|------|
| 0 | 1 | 0   | 1    |
| 1 | 0 | 0   | 1    |
| 1 | 1 | 1   | 0    |
| 0 | 0 | 0   | 1    |

GENERATING A FINE TIME OFFSET USING A SIGE PULSE GENERATOR

FIELD OF THE INVENTION

The present invention relates to methods and apparatus for the electronic production of pulses, and particularly to the electronic production of very short width pulses suitable for use in high resolution radar.

BACKGROUND OF THE INVENTION

The automotive industry is keen to provide collision avoidance radar in automobiles for a number of applications, including autonomous intelligent cruise control systems (AICC), backup aids, rear approach warning systems, systems to facilitate the pre-crash operation of air bags, stop-go/urban cruise control systems and systems to facilitate pre-crash activation of air bags in side impact situations.

Radar systems that are technically capable of performing these applications are described in, for instance, U.S. Pat. No. 6,067,040 entitled "Low cost, high resolution radar for commercial and industrial applications" issued to K. V. Puglia on May 23, 2000, the contents of which are hereby incorporated by reference. These systems typically require two, identical short pulses to be generated. The first short pulse is transmitted and reflected from a target. The second short pulse is delayed by time equal to the round trip time from the radar transmitter and back. The second, delayed short pulse is used in the receive channel of the radar system as a gated local oscillator that is mixed with the returned, transmitted pulse. This results in a DC value indicative of the phase difference between the transmitted signal and the delayed signal. This phase difference can be analyzed to obtain the exact time delay and any Doppler shift of the return signal, giving both the range and the velocity of the target. In order to detect objects at different distances, it is necessary to be able to accurately vary the time delay of the second, delayed pulse so that it matches the time taken by the first pulse to go from the radar transmitter to the target and back. In that way the delayed pulse can be made to arrive at the mixer at the same time as the returned transmitted pulse for all possible target distances within the range of the radar.

Despite the title of the aforementioned patent, a common problem facing such radar systems is the high cost of implementation. A major reason for this high cost stems from their need for high resolution distance measurements (1–10 cm) over relatively short ranges (2–50 meters). This requirement translates into a need to generate very short pulses capable of being accurately delayed relative to a reference in time steps of approximately 125 pico-seconds. If such pulses are generated and controlled using conventional digital clocks and high speed counters, a raw clock speed of approximately 10 GHz is required. Such clocks are costly and complex to implement.

SUMMARY OF THE INVENTION

Briefly described, the invention provides a method and apparatus to generate temporally short, electromagnetic pulses having a finely variable, time offset from a reference mark, by applying a combination of digital and analogue circuit concepts. Such pulses are useful in pulsed radar system in which one pulse is transmitted to the target, and a second, substantially identical pulse is used as a gated local oscillator. The second pulse must be delayed with respect to the first pulse by a time that is substantially the roundtrip time that the first pulse takes to go from the radar transmitter to the object and back. In order to detect objects at different distances, it is necessary to be able to accurately vary the time delay of the second pulse with respect to the first. The present invention is a simple, low cost way of providing the accurately delayed pulses needed in such systems.

In an exemplary embodiment of the method, a series of short electronic pulses, separated by an accurately determined time delay, are generated by driving an appropriate combination of digital logic circuits with a modified differential trigger that is partly an analogue sinusoidal voltage and partly a selectable, constant DC voltage. This differential trigger voltage is applied as the input to a base band pulse generator. In one embodiment, the base pulse generator is formed from a differential NAND gate and a differential AND gate connected so that the input is fed to both inputs of the NAND gate and to one input of the AND gate. The other input of the AND gate is fed by the output of the NAND gate. The truth table for this combinational logic circuit shows that the output is in an OFF state for all input states. However, because of the delay in the operation of the NAND gate, as the input switches from an OFF to an ON state, the AND gate experiences a brief period in which both gates are ON, and the AND gate is therefore, briefly in an ON state. In conventional digital circuits, this brief ON signal is treated as a positive going glitch or error. In the circuit of this application, this digital error becomes the analogue pulse. Moreover, the timing of this pulse, relative to a reference point of the differential input sinusoid, can be accurately and controllably varied by varying the voltage value of the constant part of the differential input.

In a preferred embodiment of the invention, fast switching SiGe CML gates and the modified differential input that is part a sinusoid and part a selectable constant voltage are used to produce a series of accurately shaped, short pulses with a controllable time off-set that are suitable for use in automotive radar applications, using only sub-GHz clocks.

These and other features of the invention will be more fully understood by references to the following drawings.

DETAILED DESCRIPTION

Figures 1, 2:
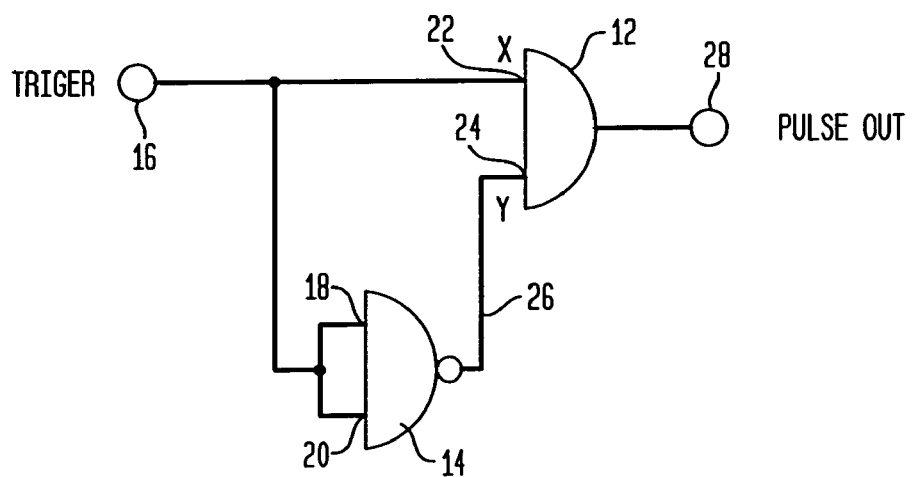
FIG. 1 is a schematic diagram of a simple base band pulse generator.
FIG. 2 is a set of logic truth tables for the elements of a simple base band pulse generator.

The present invention relates to methods and apparatus that use a combination of digital and analogue circuit concepts to generate temporally short, electromagnetic pulses having a finely variable, temporal offset from a reference mark.

Such temporally short, variable offset electromagnetic pulse generators are of considerable interest in, for instance, pulse based, high resolution radar systems where they may be used to generate a fine time-base reference. The pulse generators are particularly suited to applications such as automotive radar systems in which unit cost is a significant factor and high resolution is required over relatively short distances.

Coherent pulse radar systems suitable for use in automotive radar systems typically require two, identical short pulses to be generated. The first short pulse is transmitted and reflected from a target. The second short pulse is delayed by time equal to the round trip time from the radar transmitter and back. The second, delayed short pulse is used in the receive channel of the radar system as a gated local oscillator that is mixed with the returned, transmitted pulse to obtain a DC value indicative of the phase difference between the signals. Such systems allow both the range and the velocity of the target to be measured by analyzing both the time delay and any Doppler shift of the return signal.

As the second pulse must be delayed with respect to the first pulse by a time that is substantially the roundtrip time that the first pulse takes to go from the radar transmitter to the object and back. In order to detect objects at different distances, it is necessary to be able to accurately vary the time delay of the second pulse with respect to the first. The present invention is a simple, low cost way of providing the accurately delayed pulses needed in such systems Such an automotive radar system typically requires pulses to be generated with approximately 125 ps time steps in order to resolve distances of the order of 25 mm (approximately 1 inch). If such pulses are generated using conventional digital clocks and high speed counters, a raw clock speed of approximately 10 GHz is required. Such clocks are costly and complex to implement.

An exemplary embodiment incorporating the methods of this invention allows appropriate pulses to be generated with, for instance, a total time offset of up to 2 nsec with a time offset sensitivity of about 5.6 ps/mV using a 100 MHz trigger line and an analogue DC voltage. When using sinusoidal trigger lines, the total time offsets can be increased by using lower frequency trigger lines, with a corresponding reduction in time offset sensitivity. More complex trigger line shapes, such as but not limited to, saw tooth, triangular waves with a flat or constant spacing component, allow larger total time offsets to be achieved while maintaining the offset sensitivity for a required performance window.

The present invention will now be described with reference to the accompanying drawings in which, as far as possible, like numbers represent like elements.

FIG. 1 is a schematic diagram of a simple base band pulse generator 10, comprising an input terminal 16, an AND gate 12 having an output terminal 28 and input terminals 22 and 24, and a NAND gate 14 having an output terminal 26 and input terminals 18 and 20. Input terminal 16 is connected to AND gate input 22 and to both NAND gate input terminals 18 and 20. NAND gate output terminal 26 is connected to AND gate input terminal 24.

FIG. 2 is a set of binary logic truth tables for the elements of the simple base band pulse generator 10, i.e. for the AND and NAND gates. The AND gate only has a binary 1 (ON) output when both inputs are binary 1 (ON) and a NAND gate only has a binary 0 (OFF) when both inputs are binary 1 (ON).

Figure 3:
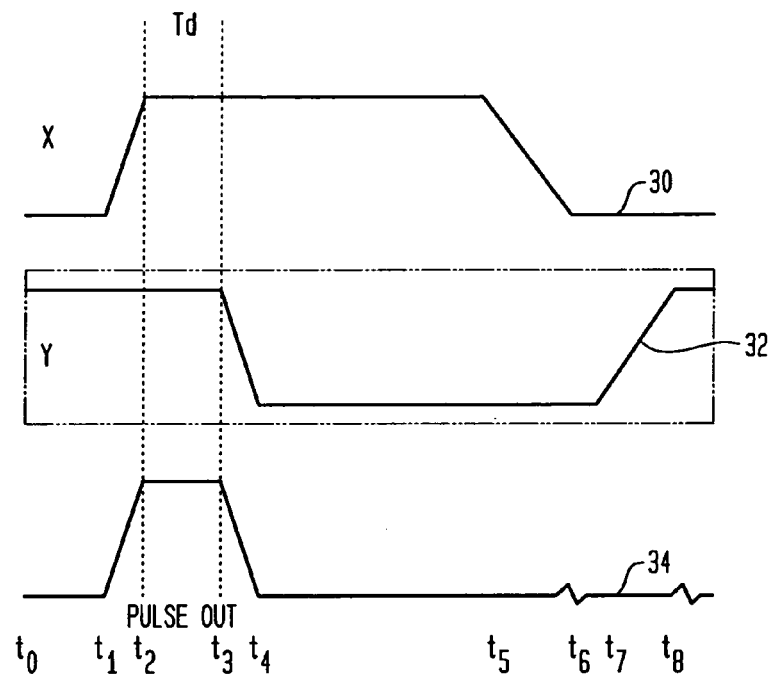
FIG. 3 is a timing diagram showing the voltages at three points in time in the simple base band pulse generator of FIG. 1 as a function of time.

FIG. 3 shows the logical state represented by voltages at three points in the simple base band pulse generator 10 as a function of time. In particular, trace 30 shows the logical state of the trigger voltage at the first AND gate input 22, trace 32 shows the logical state at the second AND gate input 24 and trace 34 shows the logical state at the AND gate output 28. For simplicity, the traces are drawn showing the delay caused by the NAND gate operation but are aligned as if the AND gate operation introduces no delay. This simplification does not have any bearing on the theory of operation as described herein and greatly simplifies the diagram and its explanation.

At a time $t_0$ the trigger voltage is in an OFF state, i.e., represented by binary 0. As a result, both NAND gate inputs 18 and 20 are also in an OFF state, so that NAND gate output 26, and hence AND gate input 24, are in an ON state. At $t_0$, the output of the simple base band pulse generator 10 is, therefore, in an OFF state. At time $t_1$, the trigger voltage begins to change stage, and, by time $t_2$, the trigger voltage is in an ON state, as is the AND gate input 22. Because of the finite time that NAND gate 20 takes to change states, at time t2, NAND gate output 26, and therefore AND gate input 24, are still in an ON state. AND gate output 28, therefore, switches to an ON state until time t3 when NAND gate output 26 starts to change state. By time t4, NAND gate output has switched to an OFF state because both NAND input gates 18 and 20 are in an ON state, and, AND gate output 28 has also switched back to an OFF state. AND gate output 28 remains in an OFF state even as the trigger voltage at input terminal 16 is switched back to an OFF state at time $t_5$ because NAND gate output 26 is still in an OFF state. By the time NAND gate output 26 switches back to an ON state at time $t_8$, AND gate input 22 is in an OFF state and, therefore output 28 continues to remain in an OFF state. As a consequence, the base band pulse generator 10 generates a short pulse, having temporal width of approximately $t_3-t_2$, from an initial pulse having a significantly greater temporal width of approximately $t_5-t_2$ In a preferred embodiment, the base band pulse generator 10 is implemented as a differential current mode logic (CML) circuit (also known as emitter coupled logic) with suitable capacitive loading. In conventional digital logic design, the short pulse between $t_2$ and $t_3$ is considered to be a rising edge, switching glitch. The width of the base band pulse is related to the differential time delay between the two AND gate inputs 22 and 24. The fidelity of the base band pulse is related to the switching speed of the logic gates.

Figure 4:
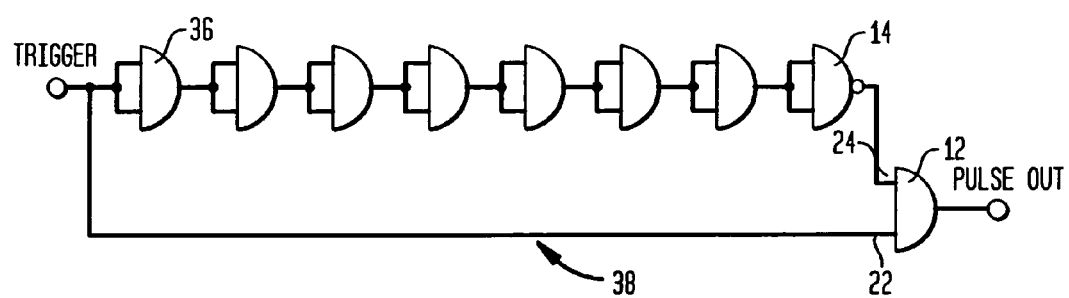
FIG. 4 is a schematic diagram of a practical embodiment of a base band pulse generator.

FIG. 4 is a schematic diagram of a realistic base band pulse generator 38, having additional AND gates 36 to provide a longer delay between the two AND gate inputs 22 and 24 and therefore a wider pulse width.

Figure 5:
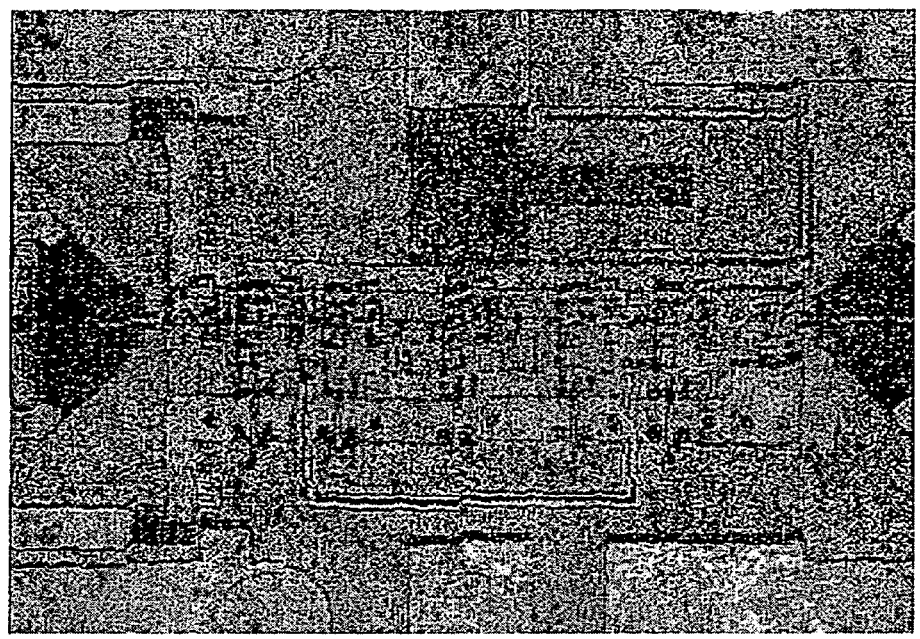
FIG. 5 is a photograph of a die of a SiGe CML die implementing a differential base band pulse generator.

FIG. 5 is a photograph of a Silicon-Germanium (SiGe) CML die of a base band pulse generator 38. SiGe technology relies on the fact that Si and Ge lattice structures have a 4% size difference. By growing a thin, epitaxial layer of germanium on silicon, the immediately underlying silicon lattice is stretched, resulting in greater carrier mobility and hence switching speed. In this way low cost, high speed transistors can be fabricated on silicon substrates using essentially conventional silicon fabrication techniques. In addition to providing high speed transistors at a low cost, SiGe technology has the added attraction of allowing the high speed transistors to be included in integrated circuits alongside conventional Complementary Metal Oxide Semiconductor (CMOS) elements.

Figure 6:
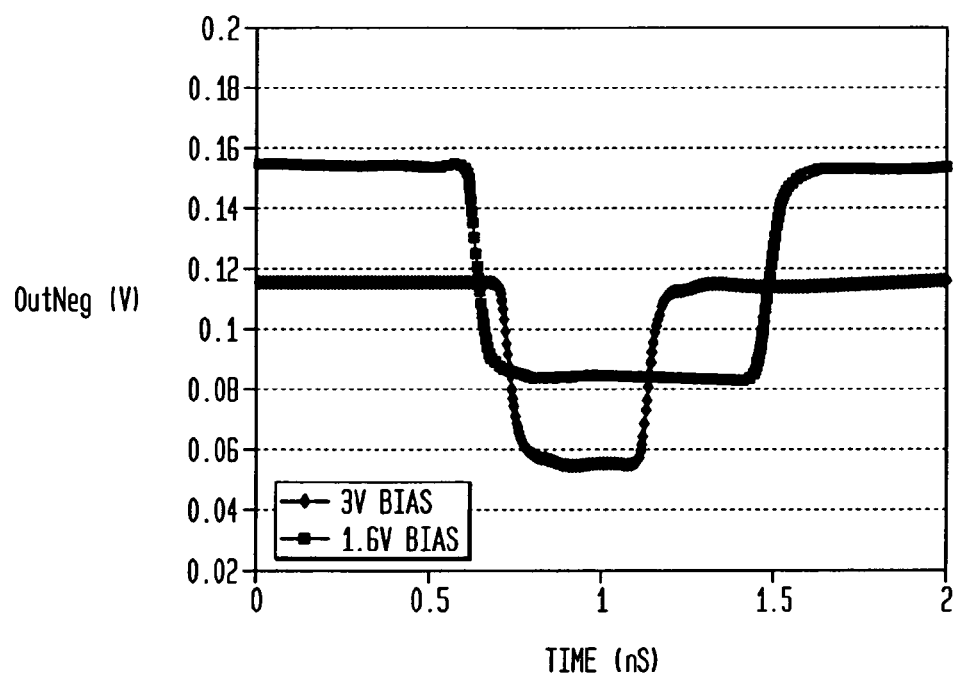
FIG. 6 is a timing diagram showing measured output voltages of a SiGe CML implementation of a differential base band generator as a function of time.

FIG. 6 shows measured output voltages as a function of time of a differential SiGe CML implementation of the base band generator 38 of FIG. 4.

In the traditional operation of a differential base band pulse generator (BBPG) 38, differential signals are applied to the BBPG input terminals, i.e., the input voltages vary essentially simultaneously, but 180 degrees out of phase, so that as one of the input voltages increases, the other decreases. In this way, a roughly constant current flow is maintained, resulting in fast, differential switching. In such a differential circuit, as the differential voltage crosses a threshold value, which is related to average molecular kinetic energy (kT) of the device, the logic circuit changes state.

Figure 7:
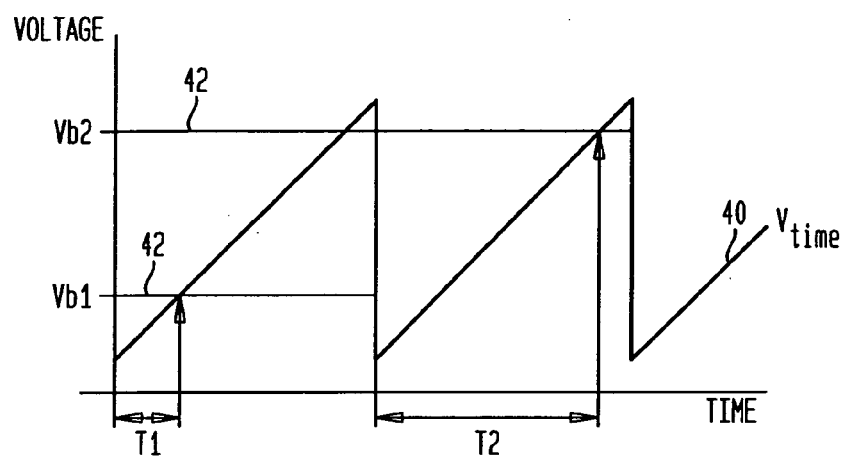
FIG. 7 is a timing diagram showing the input voltages applied to a differential base band pulse generator for operation in a comparator mode capable of varying temporal timing of an output pulse.

FIG. 7, in contrast, illustrates one embodiment of the present invention in which a differential base band pulse generator (BBPG) 38 is made to operate in a modified, comparator mode by applying non-synchronized voltages to each of the differential input terminals. In such a system, the time delay of the pulses from a reference time can be varied by altering the constant voltage 42. This provides a simple and accurate way to provide, for instance, the variably delayed gating pulses needed in a gated pulsed radar system. As the delayed pulse is delayed by a time substantially equal to the round trip time of an un-delayed pulse in such systems, a different time delay is needed for detecting objects at a different distance.

In particular, a periodic, time varying voltage 40 is applied to one input terminal of the differential input while a constant voltage 42 is applied to the other input terminal, with the constant voltage 42 having a selectable value. If the constant voltage 42 has a low value Vb1, then the differential voltage will reach approximately zero after a time delay T1 after the minimum of the periodic, time varying voltage, at which time the BBPG will produce a pulse. If the constant voltage 42 has a high value Vb2, then the differential voltage will reach approximately zero after a time delay T2 after the minimum of periodic, time varying voltage, at which time the BBPG will produce a pulse.

Figure 8:
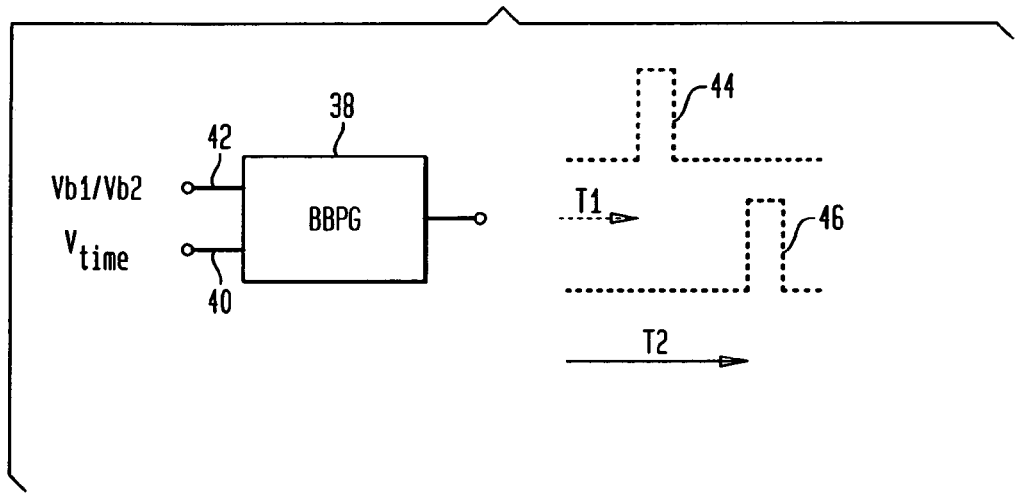
FIG. 8 is a schematic diagram of a base band pulse generator operating in a modified comparator mode and producing output pulses with varying temporal offsets.

FIG. 8 is a schematic diagram of the differential base band pulse generator (BBPG) 38 operating in a modified, comparator mode and producing output pulses with controllably varied time offsets.

A periodic, time varying voltage 40 applied to one differential input terminal of the differential BBPG 38, while the other differential input terminal is held at constant voltage 42. When this constant voltage 42 has a low value Vb1, a series of pulses 44 are generated in which each of the pulses 44 has a time offset T1 from a reference point in period voltage 40. The reference point may, for instance, be the minimum value of a sinusoid. When the constant voltage 42 has a higher value Vb2, then a series of pulses 46 is generated each having a larger time offset T2. By varying the constant or DC bias voltage, the time offset of the pulses can be controllably varied.

Figure 9:
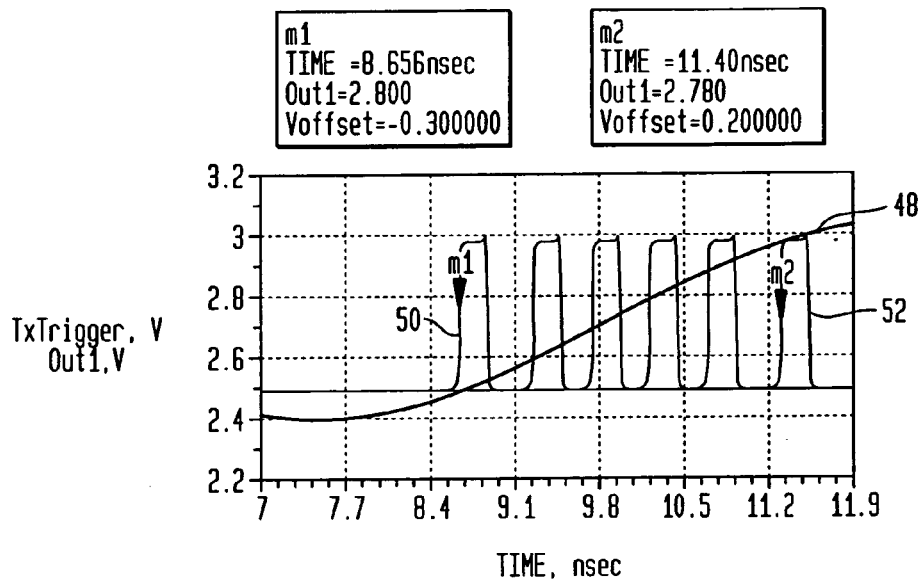
FIG. 9 is a timing diagram showing a simulation of six temporal off-set pulses produced by a six off-set delays and rising edge of a sinusoidal voltage.

FIG. 9 shows an overlay for six simulated pulses, each having a different time delay produced by a different value of the constant voltage 42 This figure does not represent a single output of the system but is the combined, overlaid outputs of six different pulses produced by six different settings of the constant voltage. Each of the pulses 50 is shown as being produced when the rising edge of the sinusoid 48 crosses the constant voltage 51. As described above, when the input to the logic gates of a BBPG 38 comprises a differential trigger voltage in which one input is a reference input and the other is a periodic, time varying trigger input, the circuit functions as a comparator. When the absolute level of a periodic, time varying trigger voltage crosses the threshold bias of the other input, the logic circuits change state and generate a pulse. In FIG. 9, the time varying voltage 48 is part of a 100 MHz, 0.4 V sinusoid that varies from 2.4 to 4 V. The timing voltage offset 51 is stepped over a range from −0.3 V to +0.2 V in 0.1 V increments, resulting in the 6 pulses shown. This provides a total offset time difference of 2.8 nsec, equivalent to 5.6 ps/mV of time offset. A pulse 50 having a minimum time offset of approximately 8.7 nsec is generated by a voltage offset of approximately −0.3 V. A pulse 52 having a maximum time offset of approximately 11.4 nsecs is generated by a voltage offset of approximately 0.2 V.

The time offset of the pulses with respect to the minimum of the sinusoidal trigger voltage is a function of rate of change of the trigger line (either gradient or frequency), as well as its amplitude. Timing jitter, i.e., the variation or error in time offset of the generated pulses, is related to, for instance, any phase noise of the signal on the trigger line, as well as to any noise on the constant voltage (also know as the DC bias level). In the example of FIG. 9, for instance, a 2 mV noise signal on the DC bias line will produce about 10 ps of timing jitter.

For a particular implementation of the modified BBPG, and a given temperature, the range over which the DC bias level can be varied is fixed. In the example of FIG. 9, for instance, the range over which the DC bias level can be varied is fixed at approximately 500 mV. Varying the amplitude of the periodic, time varying trigger line waveform will, however, change the gradient, particularly the gradient as seen at the two extremes of the bias voltage swing. The amplitude variation will therefore contribute to timing jitter as a result of any amplitude modulation (AM) noise on the trigger line. The amplitude variation will also contribute to any non-linear dependence of time offset on the DC bias voltage.

Figure 10:
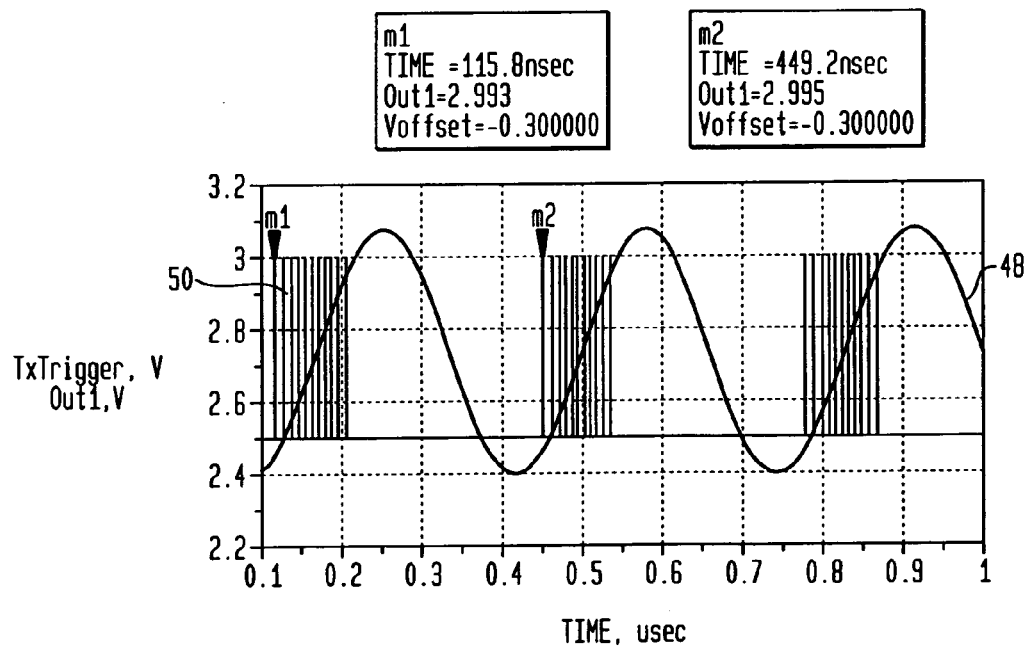
FIG. 10 is a timing diagram showing a simulation of 3 cycles of a sinusoidal trigger line and the temporal off-set pulses generated by multiple bias off-set voltages.

FIG. 10 shows a simulated series of pulses 50 overlaid on three cycles of an exemplary 3 MHz PRF sinusoidal trigger voltage 48 . This sinusoidal trigger voltage 48 may be fed to both a transmit (Tx) and a receive (Rx) trigger line on a transmit chip. Pulses 50 are, for instance, 300 ps base band impulses produced by the base band pulse generator (BBPG) circuit for different offset voltages. As detailed above, one pulse is produced each time the positive going edge of the sinusoidal trigger voltage 48 crosses a threshold at which the difference between the trigger voltage 48 and the bias offset voltage results in the digital components of the BBPG switching states. The threshold may be adjusted by adjusting the bias offset voltage over, for instance, a 0.5 V range in increments of 50 mV. With these exemplary values, there is roughly 100 ns of range adjustment, corresponding to a range of approximately 15 m. (Range d may be calculated as d=v.t, where t=100/2 ns and where v is the velocity of light). Approximately 200 range bins would be required to cover this 100 ns range in 500 ps steps, requiring that the bias offset voltage be capable of being incremented in steps of 2.5 mV. This could be provided, for example, by a 12 bit digital to analogue converter (DAC) working over a 0–3 V range, i.e., providing 0.7 mV per bit. In this example, the required voltage steps allow 3 bits per range bin increment. The unambiguous range of such a radar system is fixed by the PRF, which in this example is 3 MHz, resulting in the next in range interval being approximately 334 ns (as shown by the distance between markers M1 and M2). This yields an unambiguous range of approximately 50 m. The resolution of such a system may be estimated by assuming a noise source on the DAC of about 1 bit. This noise will result in a time offset jitter of the pulses of about 170 ps, or roughly one third of a bin range. The 170 ps jitter would give a range error of roughly 50 mm or about 2 inches.

The numbers detailed above are exemplary numbers, and may easily be varied appropriately by a person of ordinary skill in the art. The pulse width of the BBPC circuit may, for instance, be selected in a range from 300 ps to 1.2 ns using the technology detailed above.

Figure 11:
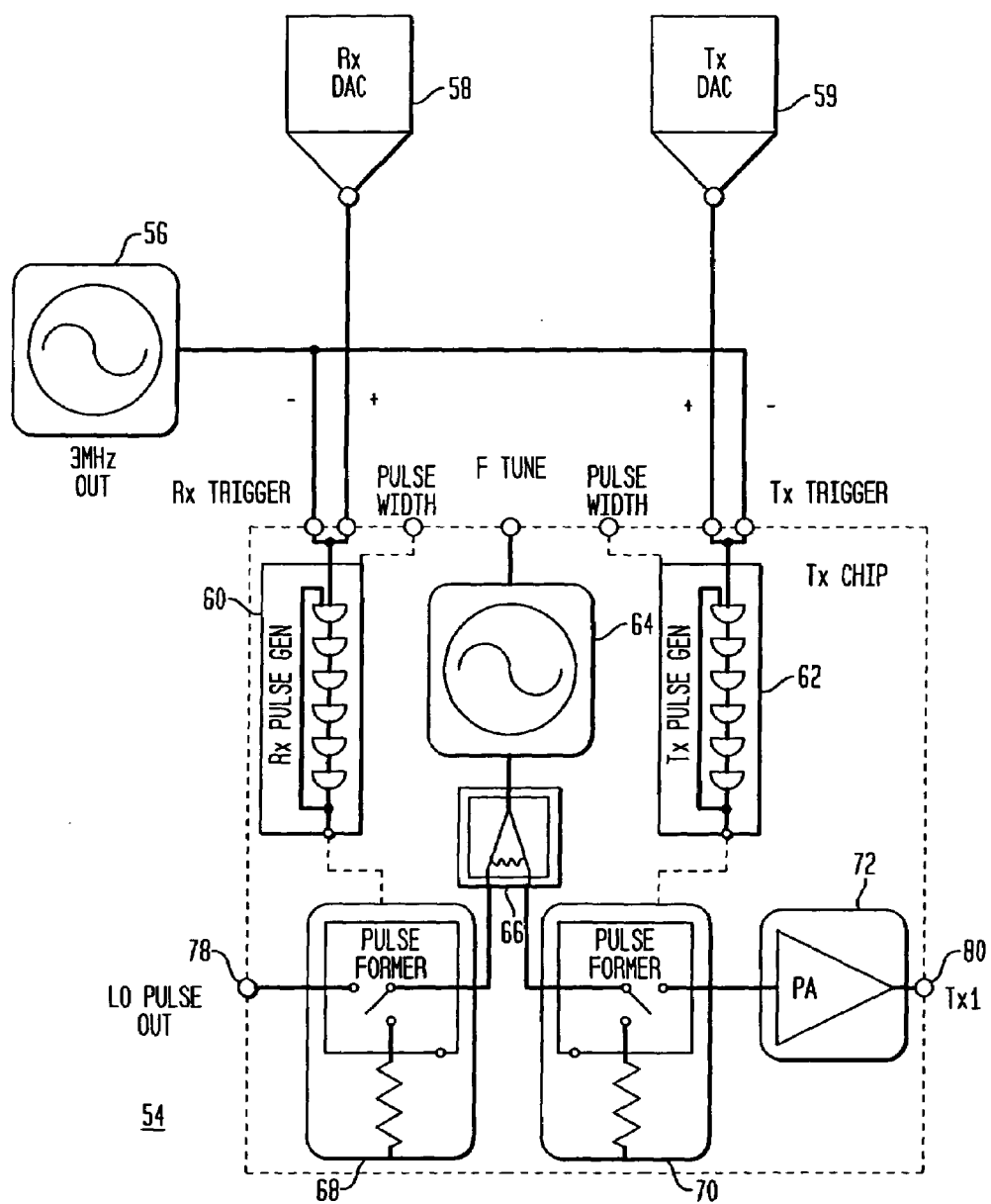
FIG. 11 is a schematic diagram of an exemplary implementation of a high resolution radar transmission and reception pulse generator.

FIG. 11 is an exemplary implementation of a high resolution radar (HRR) transmission and reception pulse generator 54 in accordance with the present invention, comprising a sinusoidal pulse repetition frequency PRF generator 56, a reception digital-to-analogue converter (DAC) 58, a transmission digital-to-analogue converter (DAC) 59, a reception differential base band pulse generator (BBPG) 60 a transmission differential BBPG 62 a transmission radio frequency (RF) generator 64, a splitter circuit 66, a reception pulse former 68, a transmission pulse former 70 and a power amplifier 72.

The signal output at terminal 80 is the coherent, pulse modulated signal that is transmitted from the radar to the target. The signal output at terminal 78 is a lower power copy of the transmitted signal, that is delayed by a time equal to the round trip time from the radar to the target. The returned, transmitted pulse and the delayed pulse are mixed in the radar reception channel to give a DC signal proportional to any phase difference between them. This mixed signal can be used to obtain both the range and the velocity of the target.

The output of the sinusoidal pulse repetition frequency PRF generator 56 is applied to one input terminal of each of the reception differential BBPG 60 and the transmission differential BBPG 62. The output of the reception digital-to-analogue converter (DAC) 58 is applied to the other input terminal of the reception differential BBPG 60. The output of the transmission digital-to-analogue converter (DAC) 59 is applied to the other input terminal of the transmission differential BBPG 62.

The train of reception pulses formed by the reception differential BBPG 60 is fed into the reception pulse former 68, where it modulates one RF signal from the RF generator 64. The modulated RF signal from the reception pulse former 68 is then fed onto the reception pulse output terminal 78.

The train of transmission pulses formed by the transmission differential BBPG 62 is fed into the transmission pulse former 79, where it modulates one RF signal from the RF generator 64. The modulated RF signal form the transmission pulse former 70 is then fed to a suitable power amplifier 72, before being fed onto the transmission pulse output terminal 80.

Figure 12:
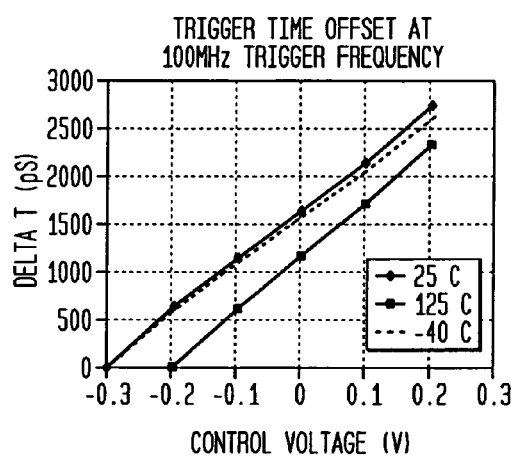
FIGS. 12–15 are graphs showing simulation results for a variety of trigger lines.

FIG. 12 shows three plots of the trigger time offset in pico-seconds as a function of control voltage for a 100 MHhz PRF. The three plots in FIG. 12 represent simulated results for three different temperatures, namely 25 degrees Centigrade, 40 degrees Centigrade and 125 degrees Centigrade.

Figure 13:
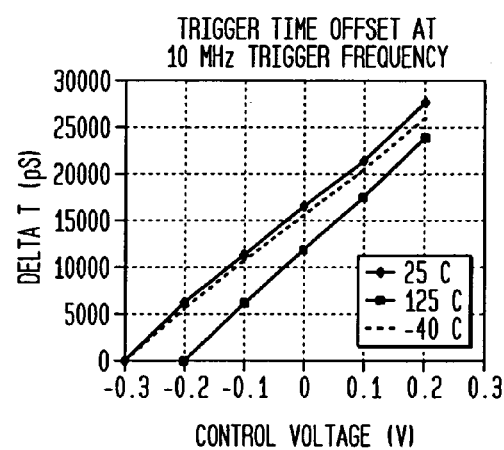
Figure 14:
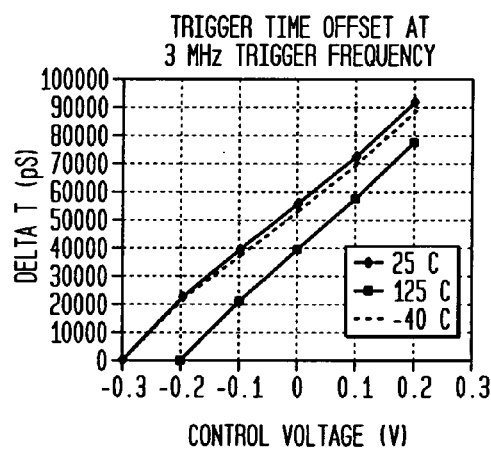
Figure 15:
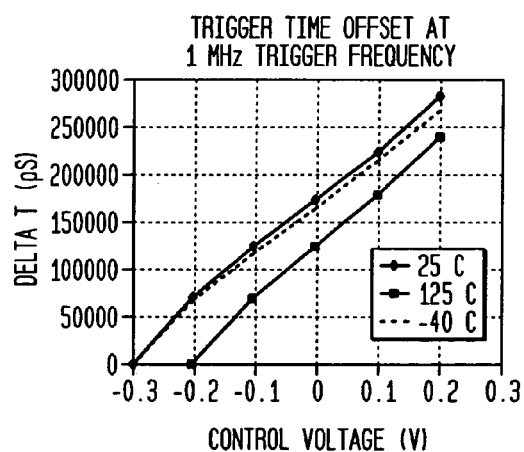

FIGS. 13–15 show analogous plots to FIG. 12, but for PRF's of 10 MH, 3 MHZ and 1 MHZ respectively.

Figure 16:
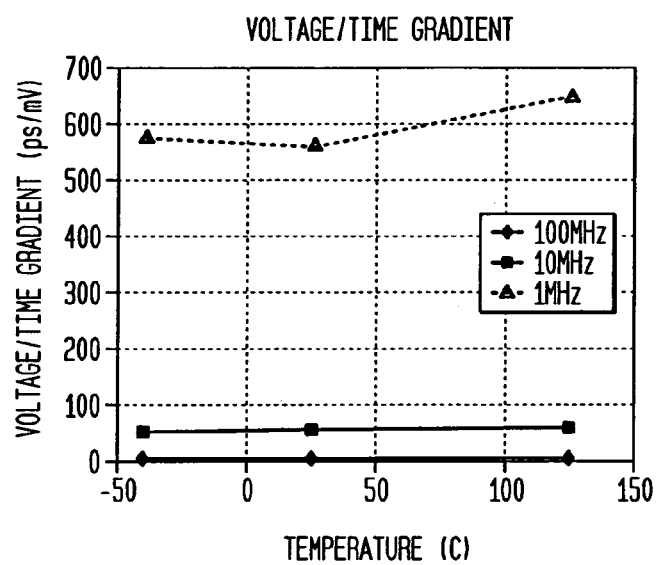
FIGS. 16–17 are graphs showing a simulation of a figure of merit versus temperature for a variety of trigger lines against temperature.

FIG. 16 shows the gradient of the time offset as a function of temperature for three pulse repetition frequencies. A figure of merit represents the gradient as ps/mV. This is plotted against temperature in degrees Centigrade for PRF's of 100 MHz, 10 MHz and 1 MHz.

Figure 17:
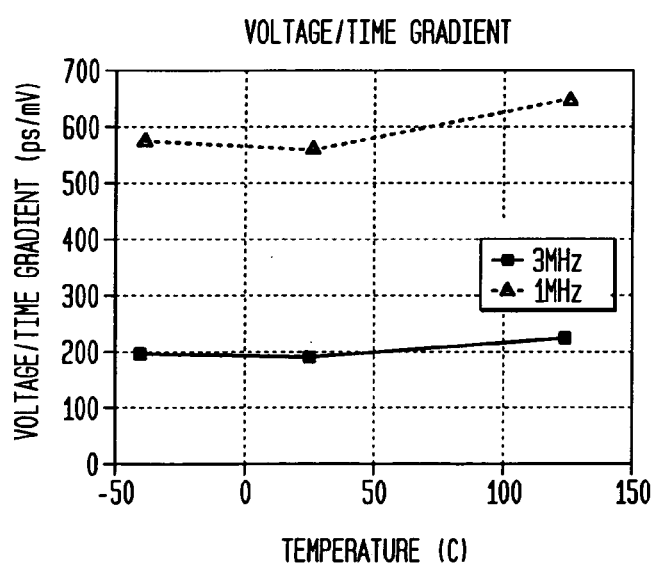

FIG. 17 shows analogous plots to FIG. 16, but for PRF's of 3 MHz and 1 MHz.

Figure 18:
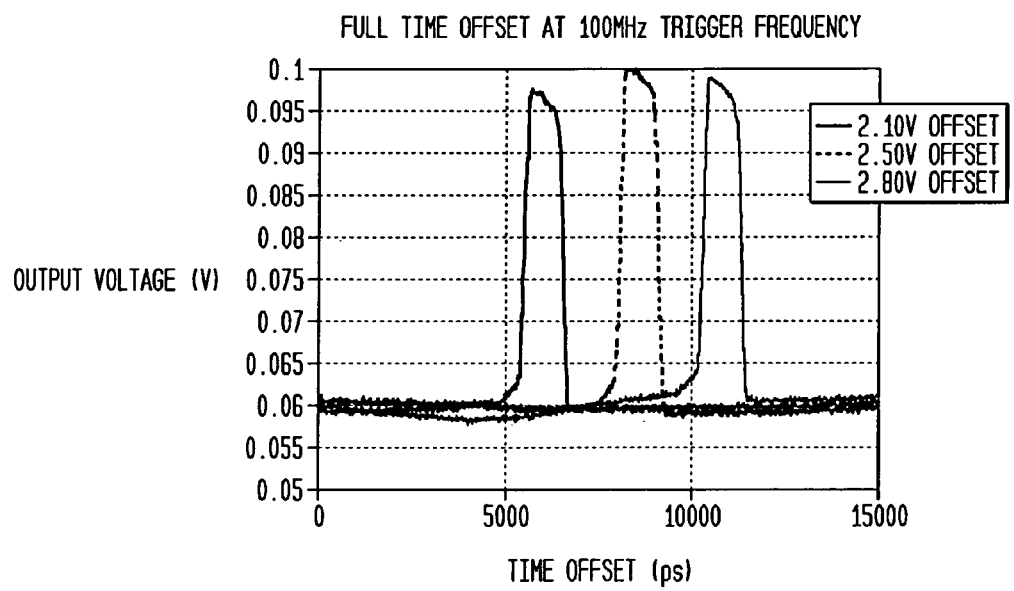
FIG. 18-19 are timing diagrams showing measured pulse widths for various offset voltages as a function of time.

FIG. 18 shows measured results of a differential SiGe CML implementation of a base-band generator 38. A DC offset bias voltage was applied to one of the differential inputs and a low phase noise, 100 MHz sinusoid to the other, the sinusoid being fixed at +10 dBm. Plots of the output pulses are shown for three values of the DC offset bias voltage, 2.1 V. 2.5 V and 2.8V. The measurements were triggered using a 10 MHz reference and the time offset relative to this reference signal was recorded as being the absolute time delay for the various DC offset bias voltages.

Figure 19:
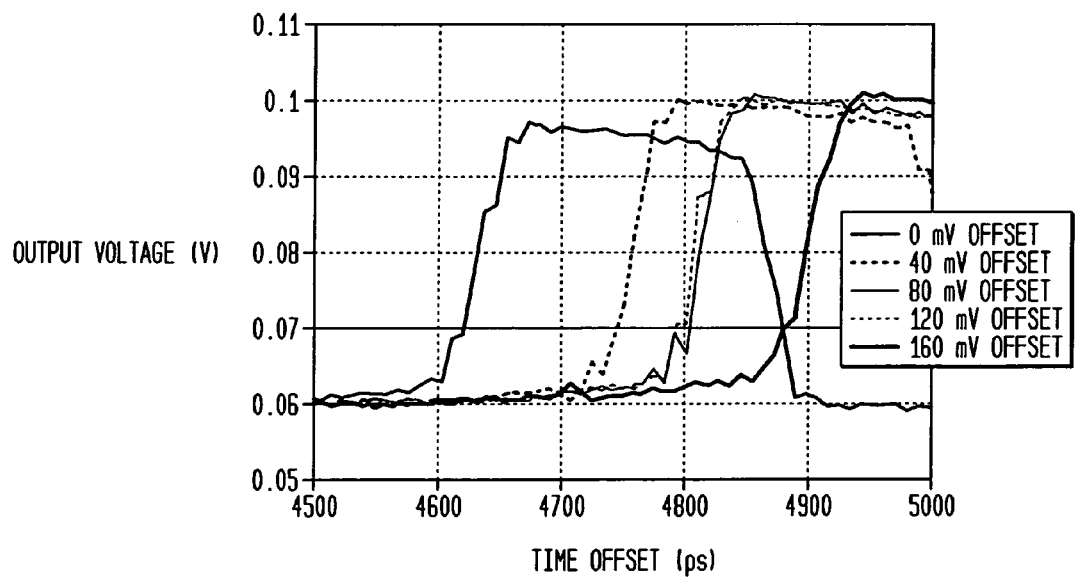

FIG. 19 shows further measured results of a differential SiGe CML implementation of a base-band generator 38 with the same 100 MHz sinusoid. In FIG. 19 the fine time offsets are obtained using fine steps of the DC offset bias voltage. A delay of 270 ps is obtained used 160 mV DC offset bias voltage. The measurement jitter evident in FIG. 19 is due, in part, to small changes in contact resistance of contact probes in the bias line that cause changes in the applied DC offset voltage, and in part to slight variation in the 10 MHz reference waveform. As the results show, a 100 MHz rise time trigger line having fine time offsets of 125 ps is achievable.

Figure 20:
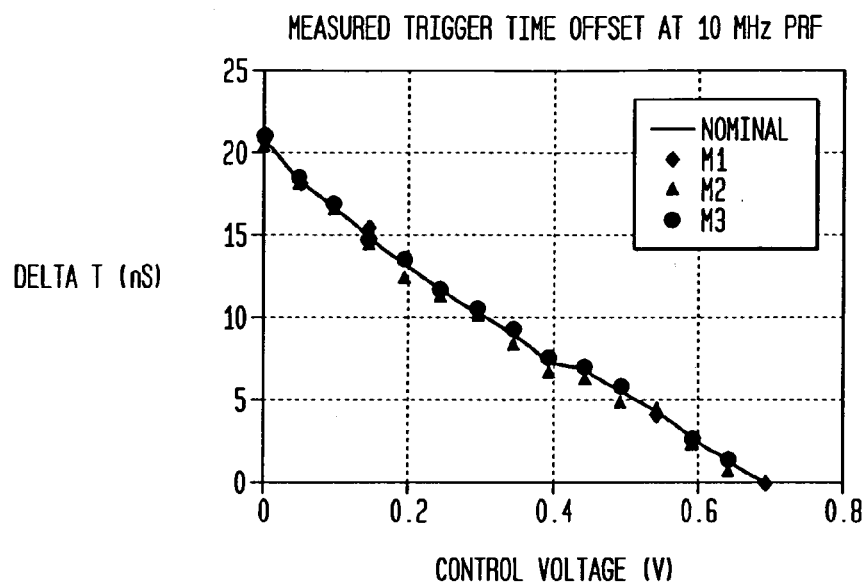
FIG. 20 is a graph showing a measured pulse time offset as a function of control voltage.

FIG. 20 shows the time off-set as a function of control voltage for a 10 MHz sinusoid. Three consecutive measurements are shown to illustrate measurement spread.

Figure 21:
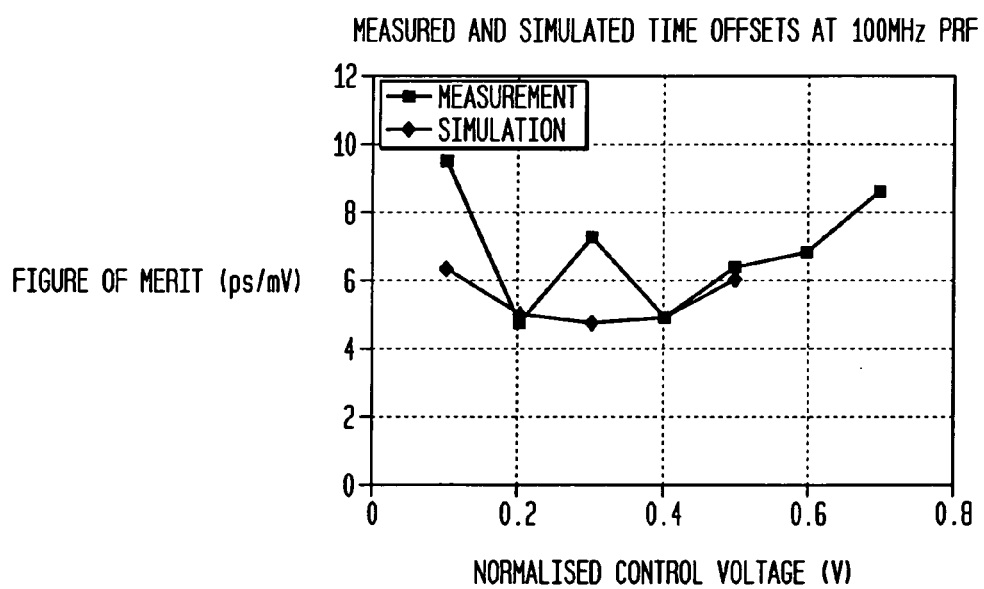
FIG. 21 is a graph showing a comparison of a measure figure of merit and a simulated figure of merit against normalized control voltage.

FIG. 21 shows a comparison of measured and simulated resulst for a 100 MHz trigger frequency. The time-shift gradient in the form of a figure of merit expressed as ps/mV is plotted against the normalized control voltage or DC off-set bias voltage. As can be seen, there is some spread in the measurement data, but there is a reasonably good agreement between the simulated and the measured results.

Although the results shown above have been at 1 MHz to 100 MHz, one of ordinary skill in the art will readily appreciate that the system and method above can be usefully applied at other frequency ranges including, but not limited, down to 10 kHz frequencies, and up to 10 GHz frequencies.

Although many of the specific results detailed above have been shown using primarily sinusoidal waveforms, one of ordinary skill in the art will readily appreciate that the systems and methods detailed above can be readily adapted to operate using other period waveforms such as, but not limited to, saw-tooth waveforms, triangular waveforms, and triangular waveforms with a flat or constant spacing component.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention

What is claimed is:

1. A method of generating a first series of short electronic pulses, each separated by an accurately determined time delay from a reference point in time, the method comprising the steps of:
   providing a first substantially constant voltage having a first voltage value;
   providing a periodic, time varying voltage;
   applying said constant voltage and said time varying voltage to input terminals of a digital, differential base band pulse generator, such that a pulse is generated when the difference between said constant voltage and said time varying voltage is substantially equal to a switching threshold of said digital pulse generator.

2. The method of claim 1, further comprising the step of selecting a second value of said first substantially constant voltage, thereby changing said time delay of said first series of short electronic pulses by an amount substantially proportional to the difference between said first and second values of said first substantially constant voltage.

3. The method of claim 1 wherein said pulse is generated when said periodic, time varying voltage is increasing in value and said difference between said constant voltage and said time varying voltage is substantially zero.

4. The method of claim 3 wherein said periodic, time varying voltage is a sinusoid.

5. The method of claim 4 wherein said sinusoid has a frequency in the range of 10 kHz to 100 MHz.

6. The method of claim 1 wherein said generator comprises a differential NAND gate and a differential AND gate, connected so that the generator input terminals are connected to both sets of NAND gate input terminals and to a first set of AND gate input terminals, the output terminals of said NAND gate are connected to a second set of AND gate terminals, and the output terminals of said AND gate are the output terminals of said generator.

7. The method of claim 6 where said generator further comprises a second differential AND gate, connected so that said generator input terminals are connected to both sets of input terminals of said second differential AND gate, and the output terminals of said second differential AND gate are connected to both sets of NAND gate input terminals.

8. The method of claim 1, further comprising the step of generating a second series of short electronic pulses, each of which has a second, accurately determined time delay from a corresponding pulse of said first series of pulses, comprising the steps of:
   providing a second substantially constant voltage;
   applying said second constant voltage and said time varying voltage to input terminals of a second digital, differential base band pulse generator, such that a pulse is generated when the difference between said second constant voltage and said time varying voltage is substantially equal to a switching threshold of said second generator, and wherein said second time delay is proportional to the difference between said first and second constant voltages.

9. An apparatus for generating a first series of short electronic pulses, each separated by an accurately determined time delay from a reference point in time, the apparatus comprising:
   a digital, differential base band pulse generator;
   a constant voltage supply, supplying a first substantially constant voltage having a first voltage value to a first input terminal of said generator; and
   a periodic voltage supply, supplying a time varying voltage to a second input terminal of said generator, such that a pulse is generated when the difference between said constant voltage and said time varying voltage is substantially equal to a switching threshold of said generator.

10. The apparatus of claim 9, wherein said first substantially constant voltage supply supplies a constant voltage have a second value, thereby changing said time delay of said first series of short electronic pulses by an amount proportional to the difference between said first and second values of said first constant voltage.

11. The apparatus of claim 9 wherein said pulse is generated when said time varying voltage is increasing in value and said difference between said constant voltage and said time varying voltage is substantially equal to zero.

12. The apparatus of claim 11 wherein said periodic, time varying voltage is a sinusoid.

13. The apparatus of claim 12 wherein said sinusoid has a frequency in the range of 1 to 100 MHz.

14. The apparatus of claim 9 wherein said generator comprises a differential NAND gate and a differential AND gate, connected so that said generator input terminals are connected to both sets of NAND gate input terminals and to a first set of AND gate input terminals, the output terminals of said NAND gate are connected to a second set of AND gate terminals, and the output terminals of said AND gate are the output terminals of said generator.

15. The apparatus of claim 14 where said generator further comprises a second differential AND gate, connected so that said generator input terminals are connected to both sets of input terminals of said second differential AND gate, and the output terminals of said second differential AND gate are connected to both sets of NAND gate input terminals.

16. The apparatus of claim 9, further comprising a:
   a second digital, differential base band pulse generator;
   a second constant voltage supply, supplying a second substantially constant voltage to a first input terminal of said second digital generator; and
   said periodic voltage supply, supplying said time varying voltage to a second input terminal of said digital generator, such that a pulse is generated when the difference between said second constant voltage and said time varying voltage is substantially equal to a switching threshold of said generator, thereby generating a second series of short electronic pulses, each pulse having a second accurately determined time delay from a corresponding pulse of said first series of pulses, said second time delay being proportional to the difference between said first and second constant voltages.

17. A device for generating a first series of short electronic pulses, each separated by an accurately determined time delay from a reference point in time, the apparatus comprising:
   digital, differential generator means for generating a base band pulse;

constant voltage means for supplying a first substantially constant voltage to a first input terminal of said generator means; and periodic voltage means for supplying a periodic, time varying voltage to a second input terminal of said generator means, such that a pulse is generated when the difference between said constant voltage and said time varying voltage is substantially equal to a switching threshold of said digital generator means.

18. The device of claim 17 wherein said periodic, time varying voltage is a sinusoid.

19. The device of claim 17 wherein said generator means comprises a differential means for NAND functionality and a differential means for AND functionality, connected so that an input to said generator means is applied to both sets of inputs to said means for NAND functionality and to a first set of inputs to said means for AND functionality, the outputs of said means for NAND functionality are connected to a second set of inputs to said means for AND functionality, and the output of said means for AND functionality are the output of said generator means.

20. The device of claim 17, further comprising:

a second digital, differential generator means for generating a base band pulse;

a second constant voltage means for supplying a second substantially constant voltage to a first input terminal of said second generator means; and means for supplying said periodic, time varying voltage to a second input terminal of said second generator means, such that a pulse is generated when the difference between said second constant voltage and said time varying voltage is substantially equal to a switching threshold of said second digital generator means, whereby a second series of short pulses is produced each having a second accurately determined time delay from a corresponding pulse of said first series of pulses, said second time delay being proportional to the difference between said first and second constant voltages.

* * * * *